(12) United States Patent
Meng et al.

(10) Patent No.: US 10,321,559 B2
(45) Date of Patent: Jun. 11, 2019

(54) DISPLAY DEVICE AND METHOD FOR DETECTING BONDING CONDITION IN BONDING AREA OF DISPLAY DEVICE

(71) Applicant: BOE TECHNOLOGY GROUP CO., LTD., Beijing (CN)

(72) Inventors: Song Meng, Beijing (CN); Danna Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 331 days.

(21) Appl. No.: 15/214,368

(22) Filed: Jul. 19, 2016

(65) Prior Publication Data
US 2017/0196080 A1  Jul. 6, 2017

(30) Foreign Application Priority Data

Jan. 4, 2016  (CN) .......................... 2016 1 0006816

(51) Int. Cl.
*H05K 1/02* (2006.01)
*H05K 1/14* (2006.01)
(Continued)

(52) U.S. Cl.
CPC ............. *H05K 1/0268* (2013.01); *H05K 1/14* (2013.01); *H05K 1/181* (2013.01); *H05K 3/361* (2013.01);
(Continued)

(58) Field of Classification Search
CPC ........ H05K 1/0268; H05K 1/181; H05K 1/14; H05K 1/118; H05K 3/361
See application file for complete search history.

(56) References Cited

U.S. PATENT DOCUMENTS 9,831,432 B2 * 11/2017 Im ...................... H01L 27/3244
2003/0201709 A1    10/2003 Mizutani et al.
(Continued)

FOREIGN PATENT DOCUMENTS

CN     1490656 A     4/2004
CN     1553430 A     12/2004
(Continued)

OTHER PUBLICATIONS

Office Action received for Chinese Patent Application No. 201610006816.4, dated Dec. 1, 2017, 10 pages (5 pages of English Translation and 5 pages of Office Action).

*Primary Examiner* — Nathan Milakovich
(74) *Attorney, Agent, or Firm* — Womble Bond Dickinson (US) LLP

(57) ABSTRACT

The display device comprises a printed circuit board, a display panel and a chip on film for connecting the printed circuit board with the display panel. The chip on film comprises a plurality of output pads and a plurality of first test pads which are close to the plurality of output pads and arranged at intervals. The display panel comprises a plurality of input pads in one-to-one correspondence with the plurality of output pads of the chip on film, and a plurality of second test pads which are close to the plurality of input pads of the display panel and arranged at intervals. A gap between two adjacent first test pads of the chip on film overlaps a second test pad of the display panel such that the two adjacent first test pads of the chip on film are connected via the second test pad of the display panel.

14 Claims, 5 Drawing Sheets

(51) Int. Cl.
*H05K 3/36* (2006.01)
*H05K 1/11* (2006.01)
*H05K 1/18* (2006.01)

(52) U.S. Cl.
CPC .... *H05K 1/118* (2013.01); *H05K 2201/10128* (2013.01)

(56) References Cited

U.S. PATENT DOCUMENTS

| | | |
|---|---|---|
| 2004/0169645 A1 | 9/2004 | Sakaki |
| 2007/0246707 A1 | 10/2007 | Deng et al. |
| 2007/0272926 A1 | 11/2007 | Deng et al. |
| 2008/0061295 A1 | 3/2008 | Wang et al. |
| 2015/0145549 A1 | 5/2015 | Wen et al. |

FOREIGN PATENT DOCUMENTS

| | | | |
|---|---|---|---|
| CN | 1945386 A | | 4/2007 |
| CN | 102819126 A | | 12/2012 |
| JP | 09-090398 A | | 4/1997 |
| JP | 11-233912 A | | 8/1999 |
| JP | 2004-125937 A | | 4/2004 |
| JP | 2013182128 A | * | 9/2013 |
| KR | 100954329 B1 | * | 4/2010 |

* cited by examiner

DISPLAY DEVICE AND METHOD FOR DETECTING BONDING CONDITION IN BONDING AREA OF DISPLAY DEVICE

RELATED APPLICATION

The present application claims the benefit of Chinese Patent Application No. 201610006816.4, filed on Jan. 4, 2016, the entire disclosure of which is incorporated herein by reference.

FIELD OF THE INVENTION

The present invention relates to the field of display technologies, and especially to a display device and a method for detecting a bonding condition in a bonding area of the display device.

BACKGROUND

The chip on film (COF) is a device formed by fixing an integrated circuit (IC) to a flexible circuit board. Such device may be used in many display devices such as LCD and OLED displays. It is usually used as a source driver and a gate driver of a display driver. In a driver circuit, one end of the COF is connected to a printed circuit board (PCB) and for receiving data signals transmitted by the PCB, and the other end of the COF is connected to a display panel for transmitting the data signals outputted by a IC in the PCB to the display panel, so as to drive the display panel for displaying.

Connecting the PCB with the display panel by the COF is generally carried out by a bonding process. The bonding process is mainly composed of a TCP bonding and a PCB bonding. The TCP bonding is to connect the COF to the display panel through pre-lamination and lamination, so that the output pads of the COF and the input pads of the display panel are pressed together. The output pads of the COF and the input pads of the display panel can be electrically connected via an anisotropic conductive film (ACF). The PCB bonding is to bond the other end of the COF to the PCB.

During the bonding process, firstly alignment and then lamination are performed. Upon lamination, there are strict requirements on the temperature, time and pressure for lamination. Imprecise alignment or unsuitable lamination conditions would lead to poor bonding. In order to detect the poor bonding, conventional methods include making judgment by powering up the display panel and performing test by means of test points. For examples, as shown in FIG. 1, a test pad 131 is respectively arranged at two sides of a chip on film 13. The test pad 131 is electrically connected to a display panel 12, and is connected to a test point 111 on a printed circuit board 11 via a test lead wire 132. As shown in FIG. 1, if there is an electrically conductive path between two test points 111 on the printed circuit board 11 which are connected via the test lead wire 132, it indicates that the bonding at the test pad 131 is good. However, such method is only able to detect whether the bonding at two sides of the bonding area for the display panel and the chip on film is good, but unable to detect occurrence of large-area poor bonding in the middle portion of the bonding area.

In conclusion, for an existing display device, it is only possible to determine bonding conditions at side positions of the bonding area after the chip on film and the display panel are laminated, while bonding conditions at other positions of the bonding area can not be detected.

SUMMARY OF THE INVENTION

Embodiments of the present invention provide a display device and a method for detecting a bonding condition in a bonding area of a display device, so as to detect the bonding condition in the bonding area after the chip on film and the display panel of the display device are laminated and determine the positions where poor bonding occurs.

An embodiment of the present invention provides a display device comprising a printed circuit board, a display panel and a chip on film for connecting the printed circuit board with the display panel, the chip on film comprising a plurality of output pads, the display panel comprising a plurality of input pads in one-to-one correspondence with the plurality of output pads of the chip on film. The chip on film further comprises a plurality of first test pads which are close to the plurality of output pads of the chip on film and arranged at intervals, the display panel further comprises a plurality of second test pads which are close to the plurality of input pads of the display panel and arranged at intervals. A gap between two adjacent first test pads of the chip on film overlaps a second test pad of the display panel such that the two adjacent first test pads of the chip on film are connected via the second test pad of the display panel.

For the display device provided by the embodiment of the invention, a plurality of second test pads are arranged at intervals in the bonding area of the display panel, a plurality of first test pads are arranged at intervals in the bonding area of the chip on film (COF), and the gap between the second test pads of the display panel corresponds to the first test pad of the COF. Namely, after the COF and the display panel are laminated, the plurality of first test pads of the COF and the plurality of second test pads of the display panel are mutually connected. By detecting the conductivity between the test pads of the display panel and the COF which are located in the bonding area, the bonding condition in the bonding area after the display panel and the COF are laminated can be determined. For the display device provided by the embodiment of the invention, the bonding condition in the whole bonding area for the display panel and the COF can be detected, and the positions where poor bonding occurs in the bonding area for the display panel and the COF can be determined by detecting the conductivity between any two test pads among these test pads.

In some embodiments, the gap between two adjacent first test pads of the chip on film has a length smaller than a length of the second test pad of the display panel which overlaps the gap.

In some embodiments, the plurality of first test pads or the plurality of second test pads are located on the same line.

In some embodiments, the chip on film further comprises a plurality of first test lines, the first test lines being connected to the first test pads of the chip on film.

In some embodiments, the printed circuit board comprises a plurality of second test lines in one-to-one correspondence with the first test lines of the chip on film.

In some embodiments, the printed circuit board further comprises a plurality of test points in one-to-one correspondence with and connected to the second test lines of the printed circuit board.

In some embodiments, the second test pads of the display panel are located between a display area and the input pads of the display panel.

Another embodiment of the invention provides a method for detecting a bonding condition in a bonding area of a display device, the display device may be the display device provided by any one of the above embodiments of the preset invention. The method comprises:

connecting the display panel with the printed circuit board via the chip on film; and determining whether there is poor bonding in the bonding area for the chip on film and the display panel by means of the first test pads of the chip on film and the second test pads of the display panel.

A further embodiment of the invention provides a display device comprising a printed circuit board, a display panel and a chip on film for connecting the printed circuit board with the display panel, the chip on film comprising a plurality of output pads, the display panel comprising a plurality of input pads in one-to-one correspondence with the plurality of output pads of the chip on film. The display panel further comprises a plurality of second test pads which are close to the plurality of input pads, the plurality of second test pads comprising two second test pads respectively located at left and right edges of a bonding area of the display panel and a second test pad located between the two second test pads. The chip on film further comprises first test lines in correspondence with the second test pads of the display panel, and the first test lines of the chip on film are connected to the second test pads of the display panel after the chip on film and the display panel are laminated.

In some embodiments, the second test pads of the display panel are located between a display area and the input pads of the display panel.

In some embodiments, two first test lines are connected to one second test pad of the display panel.

In some embodiments, the printed circuit board further comprises a plurality of test points that are respectively electrically connected to the plurality of first test lines of the chip on film.

DETAILED DESCRIPTION OF THE INVENTION

Figure 1:
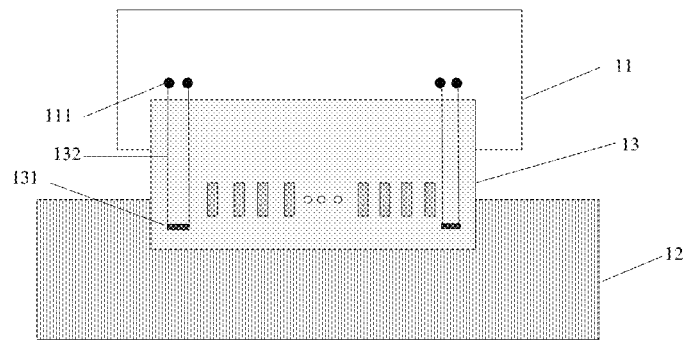
FIG. 1 is a schematic diagram illustrating the detection for bonding condition in the bonding area of a display device as provided by the prior art.

To make the objectives, technical solutions and advantages of embodiments of the invention clearer, the embodiments of the present invention are further described below in detail with reference to the drawings. Obviously, the described embodiments are just a part of the embodiments of the invention, rather than all of them. All other embodiments obtained by those ordinarily skilled in the art on the basis of these embodiments without spending inventive efforts pertain to the protection scope of the present invention.

The thicknesses, shapes and sizes of the chip on film, display panel and printed circuit board in the drawings do not reflect real scales of respective components in the display device, which are only for the purpose of schematically illustrating the contents of the embodiments of the invention.

Embodiments of the present invention provide a display device and a method for detecting a bonding condition in a bonding area of a display device, so as to detect the bonding condition in the bonding area after the chip on film and the display panel of the display device are laminated and determine the positions where poor bonding occurs.

Figure 2:
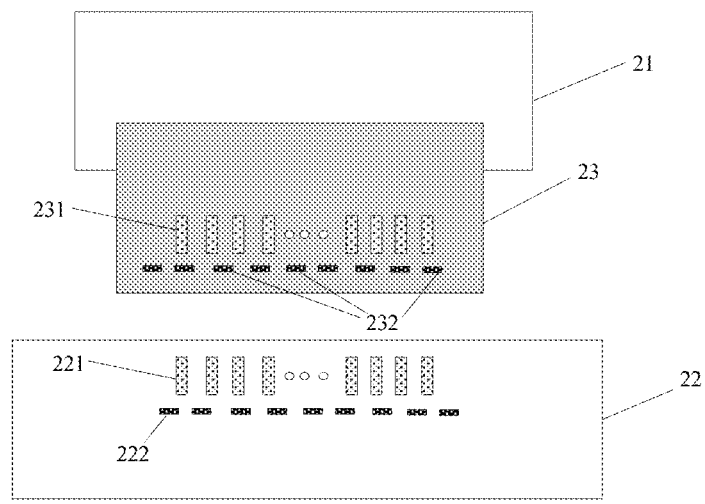
FIG. 2 is a structural schematic diagram of a display device provided by an embodiment of the present invention.

Referring to FIG. 2, a display device provided by an embodiment of the invention comprises a printed circuit board (PCB) 21, a display panel 22 and a chip on film (COF) for connecting the printed circuit board 21 with the display panel 22. The COF 23 comprises a plurality of output pads 231, the display panel 22 comprises input pads 221 in one-to-one correspondence with the output pads 231 of the COF, the COF further comprises a plurality of test pads 232 which are close to the output pads 231 of the COF and arranged at intervals, and the display panel 22 further comprises a plurality of test pads 222 which are close to the input pads 221 of the display panel 22 and arranged at intervals. A gap between two adjacent test pads 232 of the COF 23 overlaps the test pad 222 of the display panel 22 such that the two adjacent test pads 232 of the COF 23 are connected via the test pad 222 of the display panel 22. To clearly illustrate the input pads and test pads of the display panel 22, and the output pads and test pads of the chip on film 23 in the display device as proposed by embodiments of the present invention, the display panel 22 and the chip on film 23 are not connected to each other in FIG. 2. When the display panel 22 and the chip on film 23 are connected to each other, the gap between two adjacent test pads 232 of the COF 23 can overlap the test pad 222 in the display panel 22.

Herein, the test pad 232 of the chip on film 23 is also called "first test pad", and the test pad 222 of the display panel 22 is also called "second test pad".

In some embodiments, the test pads of the display panel and the test pads of the COF may be distributed at edge positions of the display panel and the COF, respectively. After bonding the display panel and the COF, the bonding condition in the bonding area for the display panel and the COF can be detected based on the conductivity between these test pads. For example, the positions of poor bonding in the bonding area for the display panel and the COF can be determined by detecting the conductivity between any two test pads. The detection of the conductivity between the test pads can be achieved by means of test lines connected to the test pads and test points connected to the test lines. Specific detection ways will be described in detail below. Certainly, other methods may also be employed to detect the conductivity between any two test pads. The protection scope of the present invention is not limited to this.

As regards this embodiment of the invention, in the bonding area, the test pads of the COF and the test pads of the display panel are connected to each other after the COF and the display panel are bonded. Specifically, two adjacent test pads of the COF are connected via a test pad of the display panel, that is, a gap between two test pads of the COF corresponds to one test pad of the display panel. After bonding the COF and the display panel, the bonding condition in the bonding area for the COF and the display panel can be determined by testing the conductivity between the test pads at two ends of the bonding area. For example, when an electrical conduction between the test pads at two ends is detected, it indicates a good bonding condition in the bonding area. When no electrical conduction between the test pads at two ends is detected, it indicates a poor bonding condition in the bonding area. Further, the specific positions where the poor bonding occurs can be detected by detecting the conductivity between any two test pads in the bonding area.

Figure 3:
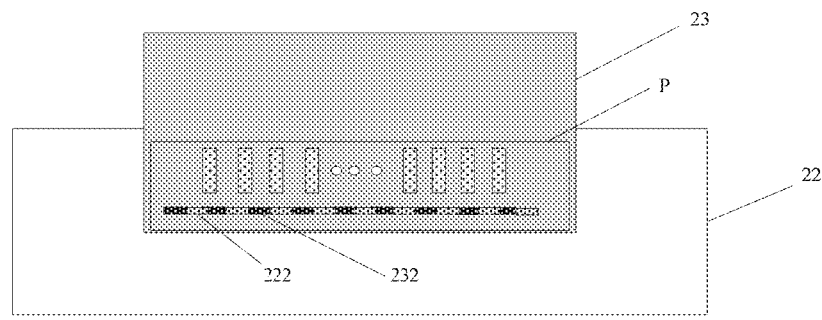
FIG. 3 is a structural schematic diagram showing that the chip on film and the display panel in the embodiment shown in FIG. 2 have been laminated.

As shown in FIG. 3, after the COF 23 and the display panel 22 are bonded, the test pads 232 of the COF and the test pads 222 of the display panel are connected to each other. When it is determined that there is an electrical conduction between the test pad 232 and the test pad 222 at the outmost sides (i.e. two ends of the bonding area P), it can be determined that the bonding condition in the bonding area P is good. When it is determined that there is no electrical conduction between the test pad 232 and the test pad 222 at the outmost sides, it can be determined that there are positions in the bonding area P where poor bonding occurs. In order to further determine the positions of poor bonding, it is possible to further determine whether the poor bonding is located in the left half part or in the right half part of the bonding area by detecting the electrical conductivity between a test pad at the middle position and the test pads at two ends. In the same way, the specific positions of poor bonding in the bonding area can be further determined based on the arrangement of the test pads of the display panel and the COF in the display device.

For the display device provided by the embodiment of the invention, a plurality of test pads are arranged at intervals in the bonding area of the display panel, a plurality of test pads are arranged at intervals in the bonding area of the chip on film (COF), and a gap between the test pads of the display panel corresponds to the test pad of the COF. Namely, the plurality of test pads of the COF and the plurality of test pads of the display panel are connected to each other after the COF and the display panel are bonded. The bonding condition in the bonding area after the display panel and the COF are laminated can be determined by detecting the conductivity between the test pads of the display panel and the COF in the bonding area. With the display device provided by the embodiment of the invention, an overall bonding condition of the whole bonding area for the display panel and the COF can be detected, and the positions where poor bonding occurs in the bonding area for the display panel and the COF may be determined by detecting the conductivity between any two test pads among the plurality of test pads.

Figure 4:
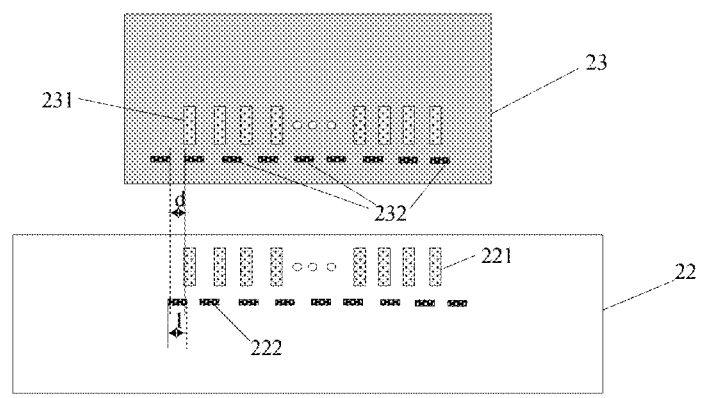
FIG. 4 is a structural schematic diagram of a chip on film and a display panel in a display device provided by another embodiment of the present invention.

In some embodiments of the present invention, referring to FIG. 4, the gap between two adjacent test pads 232 of the chip on film 23 has a length d smaller than a length l of the test pad 222 of the display panel 22 which overlaps the gap.

The test pad 222 of the display panel corresponds to the gap between the test pads 232 of the COF. In order to better connect the plurality of test pads 232 of the COF and better connect the plurality of test pads 222 of the display panel, the test pad 222 in the display panel and the test pad 232 in the COF may have an overlapped region after the COF and the display panel are bonded. Therefore, the length l of the test pad 222 is larger than the length d of the gap between two adjacent test pads 232, such that the test pad 222 of the display panel and the test pad 232 of the COF have an overlapped region, which facilitates detection of the conductivity between the test pads of the display panel and the COF. If the overlapped region of the test pad 222 of the display panel and the test pad 232 of the COF is too large, it may impact on the overall impedance of the test pads 222 and the test pads 232, which in turn influence the electrical conductivity between these test pads. Consequently, the overlapped region of the test pad 222 of the display panel and the test pad 232 of the COF should be appropriate.

In some embodiments of the invention, the plurality of test pads 222 of the display panel 22 or the plurality of test pads 232 of the COF may be located on the same line. In specific embodiments, in order to detect whether the bonding condition in the bonding area after the display panel and the COF are laminated is good, a plurality of test pads 222 and 232 are arranged on the display panel and the COF, respectively. The plurality of test pads 222 of the display panel 22 or the plurality of test pads 232 of the COF are arranged on the same line, which not only reduces the number of the test pads 222 and 232, but also prevents impact on normal wiring of the output pads 231 or input pads 221. In embodiments of the present invention, after the display panel and the COF are bonded, all the test pads including the plurality of test pads 222 of the display panel 22 and the plurality of test pads 232 of the COF may also be located on the same line.

Figure 5:
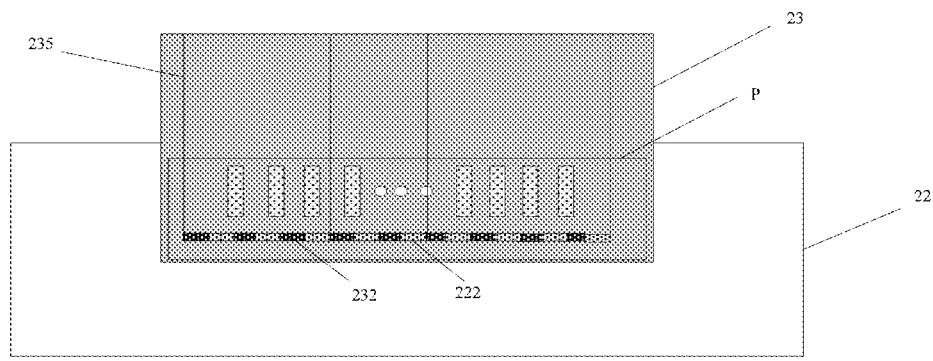
FIG. 5 is a structural schematic diagram showing that the chip on film and the display panel in the display device provided by another embodiment of the present invention have been laminated.

In some embodiments, referring to FIG. 5, the COF 23 may comprise a plurality of test lines 235. In FIG. 5, the test line 235 is connected to the two test pads located at edges of the bonding area P, respectively. Alternatively, the test line 235 may also be connected to the test pad 232 in the middle position, which can also reach the purpose of detecting whether the bonding condition in the bonding area for the display panel and the COF is good. The embodiments of the present invention are not limited to this.

In order not to influence the normal work of the output pads 231 of the COF 23, the number of the test lines 235 cannot be too large. FIG. 5 shows four test lines, which is only described as an example. Embodiments of the present invention are not limited to the arrangement of test lines as shown in FIG. 5, and other numbers of test lines 235 can be arranged.

Figure 6:
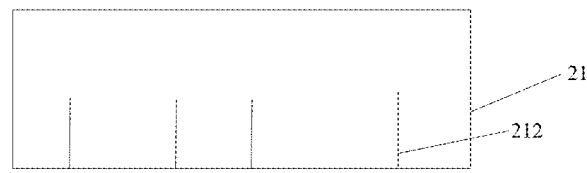
FIG. 6 is a structural schematic diagram of a printed circuit board provided by another embodiment of the present invention.

In some embodiments, referring to FIG. 6, the printed circuit board 21 comprises a plurality of test lines 212 in one-to-one correspondence with the test lines 235 of the COF 23. After connecting the printed circuit board 21 with the COF 23, the test lines 212 of the printed circuit board are in one-to-one correspondence with the test lines 235 in the COF and are mutually connected therewith. Herein, the test line 235 of the COF 23 is also called "first test line", and the test line 212 of the printed circuit board 21 is also called "second test line".

Figure 7:
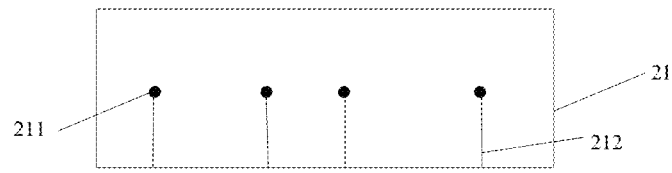
FIG. 7 is a structural schematic diagram of a printed circuit board provided by yet another embodiment of the present invention.

In some embodiments of the present invention, referring to FIG. 7, the printed circuit board (PCB) 21 comprises a plurality of test points 211 in one-to-one correspondence with and connected to the test lines 212. FIG. 7 only shows four test points, but embodiments of the present invention are not so limited.

In this embodiment, the test lines 235 can be connected to the test points 211. Therefore, the conductivity between the test pads connected to the test lines 235 can be detected at the test points 211.

In some embodiments, the test pads 222 of the display panel 22 may be located between the display area and the input pads 221 of the display panel. In specific embodiments, the display panel 22 may comprise a plurality of input pads 221 and a display area. The arrangement of the test pads 222 between the display area and the input pads 221 may not impact on the normal display in the display area and the normal signal input to the input pad 221.

Figure 8:
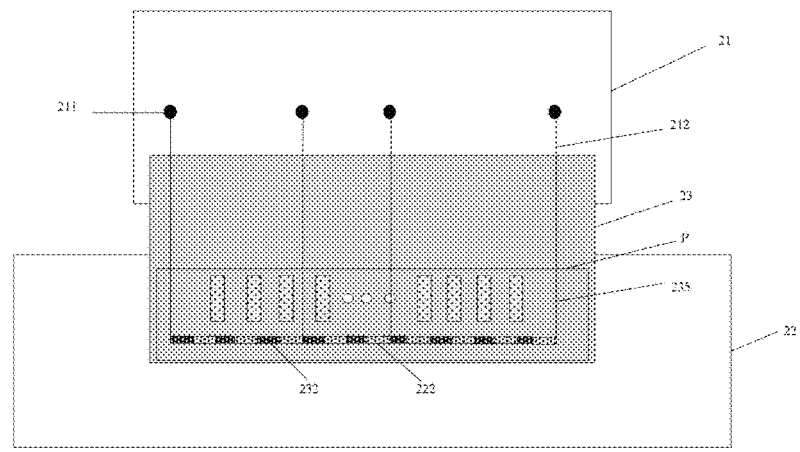
FIG. 8 is a structural schematic diagram showing a printed circuit board, a chip on film and a display panel in a display device provided by a further embodiment.

FIG. 8 illustrates a schematic diagram showing that the printed circuit board 21 is connected with the display panel 22 by the COF 23, and FIG. 8 only shows four test lines 235 and four test lines 212 as well as four test points 211, but embodiments of the present invention are not so limited. The numbers of the test lines 212 or 235 and the test points 211 may be determined based on the size of the COF 23 of the display device. In FIG. 8, the plurality of test pads 232 and 222 are connected together to form a line. The conductivity between the test pads 232 and the test pads 222 can be detected by means of the test lines 212 and 235 connected to the test pads 232 or 222, and the test points 211 connected to the test lines 212, thereby determining the bonding condition in the bonding area P for the display panel 22 and the COF 23.

In conclusion, for the display device provided by the above embodiments of the present invention, a plurality of second test pads are arranged at intervals in the bonding area of the display panel, a plurality of first test pads are arranged at intervals in the bonding area of the COF, and the gap between the second test pads of the display panel corresponds to the first test pad of the COF. Namely, after the COF and the display panel are laminated, the plurality of first test pads of the COF and the plurality of second test pads of the display panel are mutually connected. The bonding condition in the bonding area after the display panel and the COF have been laminated can be determined by detecting the conductivity between the test pads at edges (two ends) of the bonding area. Further, in the case of determining that there is poor bonding in the bonding area, the positions of poor bonding in the bonding area can be determined by detecting the conductivity between any two test pads. Therefore, with the display device provided by embodiments of the present invention, the bonding condition in the bonding area for the display panel and the COF may be detected, and the positions where poor bonding occurs can be determined.

Figure 9:
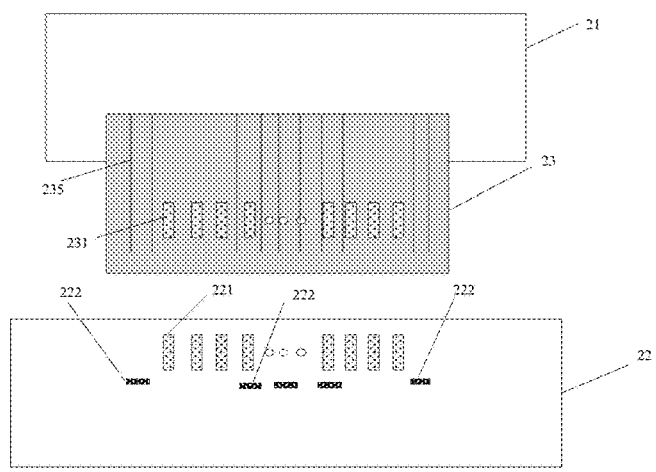
FIG. 9 is a structural schematic diagram showing a printed circuit board, a chip on film and a display panel in a display device provided by a further embodiment of the present invention.

FIG. 9 shows a display device provided by another embodiment of the present invention. As shown in FIG. 9, the display device may comprise a printed circuit board (PCB) 21, a display panel 22 and a chip on film (COF) 23 for connecting the printed circuit board 21 with the display panel 22. The COF 23 may comprise a plurality of output pads 231. The display panel 22 may comprise input pads 221 in one-to-one correspondence with the output pads 231 of the COF 23, and a plurality of second test pads 222 close to the input pads 221. The plurality of second test pads 222 include two second test pads 222 located at left and right edges of the bonding area of the display panel 22, and a second test pad 222 located between the two second test pads 222. The COF 23 further comprises first test lines 235 corresponding to the second test pads 222 of the display panel 22, and after the COF and the display panel are laminated, the first test lines 235 of the COF are connected to the second test pads 222 of the display panel.

For this embodiment of the invention, the edge positions of the bonding area of the display panel are provided with one second test pad respectively, and a plurality of second test pads are arranged between the two second test pads. After aligning and bonding the COF and the display panel of the display device by means of bonding process, the test lines of the COF are connected to the second test pads of the display panel. Consequently, it is possible to determine whether there is poor bonding in the bonding area after the COF and the display panel are laminated by detecting the conductivity between the test lines and the second test pads.

In this embodiment, the plurality of second test pads 222 may be distributed in the whole boding area, and the bonding condition at any position of the bonding area can be detected using the test lines connected to the plurality of second test pads 222. Therefore, with the display device provided by the embodiment of the invention, the bonding conditions at edge positions of the bonding area after the chip on film and the display panel have been laminated can be detected, but also it can be detected whether there is poor bonding at other positions of the bonding area after the chip on film an the display panel have been laminated, thereby determining the bonding condition for the whole bonding area.

In embodiments of the present invention, any number of second test pads may be arranged at any positions between the two second test pads at edges of the bonding area. Furthermore, the plurality of second test pads located between the two test pads at edges of the bonding area in the display panel 22 may be mutually connected and may also be arranged at intervals.

Figure 10:
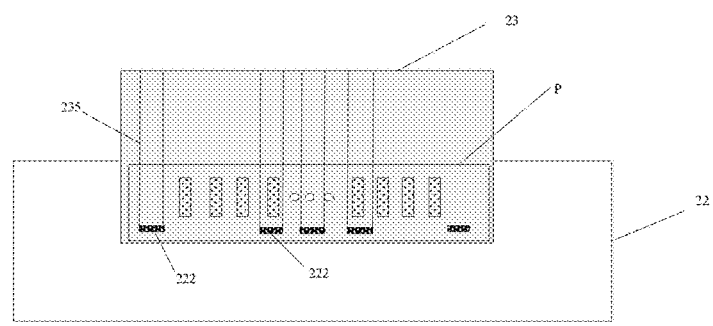
FIG. 10 is a structural schematic diagram showing that the chip on film and the display panel in the display device provided by a further embodiment of the present invention have been laminated.

Referring to FIG. 10, the chip on film (COF) 23 comprises a plurality of test lines 235, and the plurality of test lines 235 are connected to the plurality of second test pads 222, respectively. In an embodiment, two test lines 235 may be connected to one second test pad 222 for testing the electrical conductivity of the second test pad 222 after the display panel 23 and the COF 22 have been laminated.

In some embodiments, the number of the test lines 235 may be smaller than that of the output pads of the COF, so as to decrease impact on the normal work of the output pads of the COF.

Similarly, the printed circuit board may comprise a plurality of test points (not shown in FIG. 10) in one-to-one correspondence with and connected to the test lines 235. Since the test lines are connected to the test points, the conductivity of the second test pads connected to the test lines can be tested at the test points.

In some embodiments, the second test pads 222 of the display panel may be located between the display area and the input pads 221 of the display panel. The arrangement of the second test pads between the display area and the input pads may not impact on the normal display in the display area and the normal signal input to the input pads. For the display device provided by this embodiment of the present invention, by arranging a plurality of second test pads between two second test pads at edge positions of the bonding area of the display panel, when the COF and the display panel in the display device are aligned and laminated by bonding process, it can be determined whether there is poor bonding in the bonding area after the COF and the display panel are laminated by detecting the conductivity between the second test pads and the test lines in the COF. In this way, with the display device provided by the embodiment of the invention, the bonding condition at any position of the bonding area after the chip on film and the display panel have been laminated can be detected.

A method for detecting the bonding condition in the bonding area of the display device provided by an embodiment of the present invention will be introduced below in detail with reference to the aforesaid embodiments.

Figure 11:
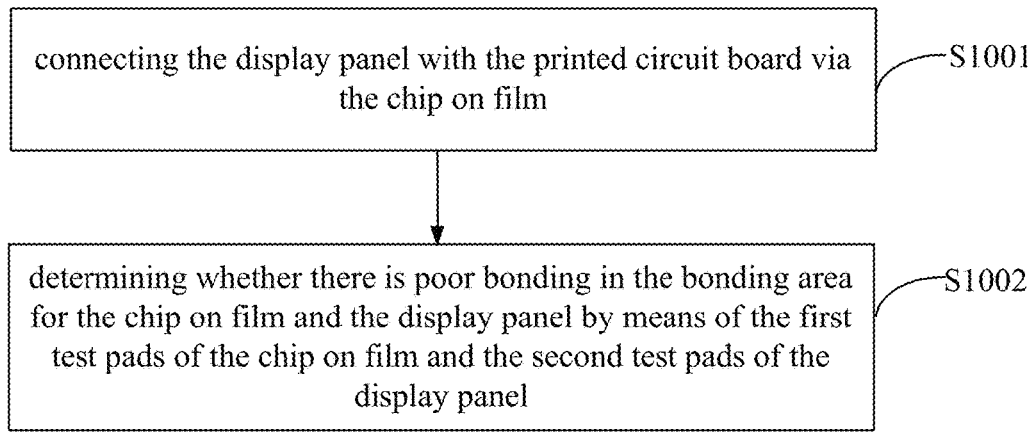
FIG. 11 is a flow chart of a method for detecting a bonding condition in a bonding area of a display device as provided by another embodiment of the present invention.

Referring to FIG. 11, the method for detecting the bonding condition in the bonding area of the display device provided by an embodiment of the invention may comprise steps of:

S1001, connecting the display panel with the printed circuit board via the chip on film;

S1002, determining whether there is poor bonding in the bonding area for the chip on film and the display panel by means of the first test pads of the chip on film and the second test pads of the display panel.

For example, for the display device shown in FIG. 8, after the display panel 22 and the printed circuit board 21 have been connected via the chip on film 23, the test pads 222 in the display panel 22 and the test pads 232 in the chip on film 23 are connected to each other. The test pads located at two ends of the bonding area and the test pads at the middle positions of the bonding area are connected to the test lines 235, respectively, and the printed circuit board 21 comprises the test points 211 connected to the test lines 235. Consequently, the bonding condition for the display panel and the chip on film in the bonding area can be determined by testing the conductivity between the test points 211 connected to the test pads at two ends of the bonding area. Specifically, when there is a current between the two test points corresponding to the test pads at two ends of the bonding area, it can be determined that the bonding condition for the display panel and the chip on film in the bonding area is good. Otherwise, if no current is detected between the two test points corresponding to the test pads at two ends of the bonding area, it can be determined that there is poor bonding at one or more positions in the bonding area for the display panel and the chip on film. Further, the positions of poor bonding in the bonding area for the display panel and the chip on film can be determined based on the conductive condition between two test points corresponding to any two test pads.

Figure 12:
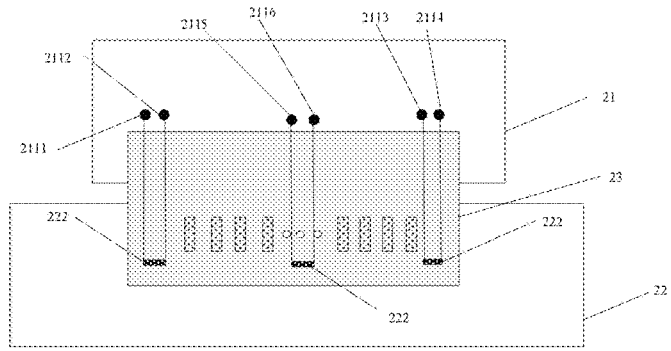
FIG. 12 is a schematic diagram for illustrating a method for detecting a bonding condition in a bonding area of the display device shown in FIG. 9.

FIG. 12 shows a schematic diagram for illustrating the detection of bonding condition in the bonding area of the display device in accordance with another embodiment of the invention. Referring to FIG. 12, the chip on film 23 connects the display panel 22 with the printed circuit board 21. The printed circuit board 21 may comprise a plurality of test points, for example, a first test point 2111, a second test point 2112, a third test point 2113, a fourth test point 2114, a fifth test point 2115, a sixth test point 2116. The display panel 22 may comprise three second test pads 222. Two probes may be placed on the first test point 2111 and the second test point 2112, respectively. When it is determined that a current is generated between the first test point 2111 and the second test point 2112, it can be determined that the bonding condition at the left edge position of the bonding area for the display panel and the chip on film is good, otherwise, when no current is generated between the first test point 2111 and the second test point 2112, it can be determined that there is poor bonding at the left edge position of the bonding area for the display panel and the chip on film. The two probes may also be placed on the third test point 2113 and the fourth test point 2114, respectively. When it is determined that a current is generated between the third test point 2113 and the fourth test point 2114, it can be determined that the bonding condition at the right edge position in the bonding area for the display panel and the chip on film is good, otherwise, when no current is generated between the third test point 2113 and the fourth test point 2114, it can be determined that there is poor bonding at the right edge position of the bonding area for the display panel and the chip on film. Then the two probes may be placed on the fifth test point 2115 and the sixth test point 2116, respectively. When it is determined that a current is generated between the fifth test point 2115 and the sixth test point 2116, it can be determined that the bonding condition at the middle position in the bonding area for the display panel and the chip on film is good, otherwise, when no current is generated between the fifth test point 2115 and the sixth test point 2116, it can be determined that there is poor bonding at the middle position of the bonding area for the display panel and the chip on film.

Figure 13:
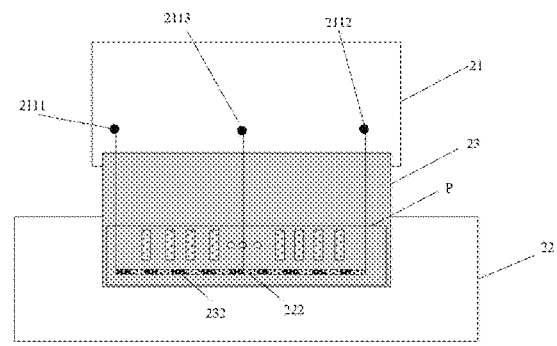
FIG. 13 is a schematic diagram for illustrating a method for detecting a bonding condition in a bonding area of the display device shown in FIG. 2.

A method for detecting the bonding condition in the bonding area of the display device according to another embodiment of the invention is introduced below with reference to FIG. 13. Referring to FIG. 13, the printed circuit board 21 may comprise three test points, for example, a first test point 2111, a second test point 2112 and a third test point 2113. The display panel 22 and the chip on film 23 comprise a plurality of test pads 222 and test pads 232, respectively. Two probes may be placed on the first test point 2111 and the second test point 2112, respectively. When it is determined that a current is generated between the first test point 2111 and the second test point 2112, it can be determined that the overall bonding condition in the bonding area for the display panel and the chip on film is good, that is, there is no poor bonding. Otherwise, when it is determined that no current is generated between the first test point 2111 and the second test point 2112, it indicates that there is poor bonding in the bonding area. Then the two probes may be placed on the first test point 2111 and the third test point 2113, respectively. When it is determined that a current is generated between the first test point 2111 and the third test point 2113, it can be determined that there is poor bonding in the right half part of the bonding area for the display panel and the chip on film. When it is determined that no current is generated between the first test point 2111 and the third test point 2113, it can be determined that there is poor bonding in the left-half part of the bonding area for the display panel and the chip on film. In practical applications, a plurality of test lines can be led out from the bonding area in order to determine which positions of the bonding area involve poor bonding.

In conclusion, for the display devices provided by some embodiments of the invention, a plurality of second test pads are arranged at intervals in the bonding area of the display panel, a plurality of first test pads are arranged at intervals in the bonding area of the COF, and a gap between the second test pads of the display panel corresponds to the first test pad of the COF. Namely, after the COF and the display panel are laminated, the plurality of first test pads of the COF and the plurality of second test pads of the display panel are mutually connected. By detecting the conductivity between the test pads at two ends (edges) of the bonding area, the overall bonding condition for the bonding area after the display panel and the COF have been laminated can be determined. Further, in the case of determining there is poor bonding in the bonding area, the positions where poor bonding occurs in the bonding area can be determined by detecting the conductivity between any two test pads. In this way, for the display devices provided by embodiments of the invention, the bonding condition in the bonding area for the display panel and the COF can be determined, but also the positions where poor bonding occurs can be determined.

Obviously, those skilled in the art can make various modifications and variations to these embodiments without departing from the spirit and scope of the invention. In this way, if these modifications and variations to the present disclosure pertain to the scope of the claims of the invention and equivalent technologies thereof, the present invention also intends to encompass these modifications and variations.

The invention claimed is:

1. A display device comprising a printed circuit board, a display panel and a chip on film for connecting the printed circuit board with the display panel, the chip on film comprising a plurality of output pads, the display panel comprising a plurality of input pads, each one of the plurality of input pads corresponding to and coupled with a respective output pad of the plurality of output pads, wherein the chip on film further comprises a plurality of first test pads which are spaced from the plurality of output pads of the chip on film and arranged at intervals, the display panel further comprises a plurality of second test pads which are spaced from the plurality of input pads of the display panel and arranged at intervals, wherein a gap between every two adjacent first test pads of the plurality of first test pads of the chip on film overlaps a respective second test pad of the display panel such that all of the plurality of first test pads of the chip on film are connected via the second test pads of the display panel.

2. The device according to claim 1, wherein the gap between two adjacent first test pads of the plurality of first test pads of the chip on film has a length smaller than a length of the second test pad of the display panel which overlaps the gap.

3. The device according to claim 2, wherein the plurality of first test pads or the plurality of second test pads are located on a same line.

4. The device according to claim 3, wherein the chip on film further comprises a plurality of first test lines, which are connected to at least some of the plurality of first test pads of the chip on film, respectively.

5. The device according to claim 4, wherein the printed circuit board comprises a plurality of second test lines in one-to-one correspondence with the first test lines of the chip on film.

6. The device according to claim 5, wherein the printed circuit board further comprises a plurality of test points in one-to-one correspondence with and connected to the second test lines of the printed circuit board.

7. The device according to claim 1, wherein the second test pads of the display panel are located between a display area and the input pads of the display panel.

8. A method for detecting a bonding condition in a bonding area of a display device as defined in claim 1, wherein the method comprises:

connecting the display panel with the printed circuit board via the chip on film;

determining whether there is poor bonding in the bonding area for the chip on film and the display panel by means of the first test pads of the chip on film and the second test pads of the display panel.

9. The method according to claim 8, wherein the gap between two adjacent first test pads of the chip on film has a length smaller than a length of the second test pad of the display panel which overlaps the gap.

10. The method according to claim 9, wherein the plurality of first test pads or the plurality of second test pads are located on a same line.

11. The method according to claim 10, wherein the chip on film further comprises a plurality of first test lines, the first test lines being connected to the first test pads of the chip on film.

12. The method according to claim 11, wherein the printed circuit board comprises a plurality of second test lines in one-to-one correspondence with the first test lines of the chip on film.

13. The method according to claim 12, wherein the printed circuit board further comprises a plurality of test points in one-to-one correspondence with and connected to the second test lines of the printed circuit board.

14. The method according to claim 8, wherein the second test pads of the display panel are located between a display area and the input pads of the display panel.

* * * * *